(12) United States Patent
Mutyala et al.

(10) Patent No.: US 11,270,903 B2
(45) Date of Patent: Mar. 8, 2022

(54) MULTI ZONE ELECTROSTATIC CHUCK

(71) Applicant: Applied Materials, Inc., Santa Clara, CA (US)

(72) Inventors: Madhu Santosh Kumar Mutyala, Santa Clara, CA (US); Sanjay Kamath, Fremont, CA (US); Deenesh Padhi, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 36 days.

(21) Appl. No.: 16/717,245

(22) Filed: Dec. 17, 2019

(65) Prior Publication Data

US 2021/0183678 A1 Jun. 17, 2021

(51) Int. Cl.
*H01T 23/00* (2006.01)
*H01L 21/683* (2006.01)
*H01L 21/67* (2006.01)

(52) U.S. Cl.
CPC .... *H01L 21/6833* (2013.01); *H01L 21/67248* (2013.01)

(58) Field of Classification Search
None
See application file for complete search history.

(56) References Cited

U.S. PATENT DOCUMENTS

| 6,488,820 B1 | 12/2002 | Burkhart | |
| 8,607,731 B2* | 12/2013 | Hoffman | H01L 21/6833 |
| | | | 118/723 E |
| 9,706,605 B2* | 7/2017 | Volfovski | H05B 3/26 |
| 10,153,139 B2* | 12/2018 | Yang | H01J 37/321 |
| 2007/0223173 A1 | 9/2007 | Fujisawa et al. | |

FOREIGN PATENT DOCUMENTS

| JP | H06-104164 A | 4/1994 |
| WO | 2013-062833 A1 | 5/2013 |
| WO | 2018-163935 A1 | 9/2018 |

OTHER PUBLICATIONS

International Search Report and Written Opinion dated Apr. 15, 2021 in International Patent Application No. PCT/US2020/065129, 9 pages.

* cited by examiner

*Primary Examiner* — Stephen W Jackson
(74) *Attorney, Agent, or Firm* — Kilpatrick Townsend & Stockton LLP

(57) ABSTRACT

Exemplary semiconductor processing chambers may include a pedestal comprising a platen configured to support a semiconductor substrate across a surface of the platen. The chambers may include a first conductive mesh incorporated within the platen and configured to operate as a first chucking mesh. The first conductive mesh may extend radially across the platen. The chambers may include a second conductive mesh incorporated within the platen and configured to operate as a second chucking mesh. The second conductive mesh may be characterized by an annular shape. The second conductive mesh may be disposed between the first conductive mesh and the surface of the platen.

18 Claims, 3 Drawing Sheets

MULTI ZONE ELECTROSTATIC CHUCK

TECHNICAL FIELD

The present technology relates to semiconductor processes and chamber components. More specifically, the present technology relates to chamber components and processing methods.

BACKGROUND

Integrated circuits are made possible by processes which produce intricately patterned material layers on substrate surfaces. Producing patterned material on a substrate requires controlled methods of formation and removal of exposed material. As device sizes continue to shrink, materials deposited may impart stresses on substrates, which may result in bowing of the substrate. During subsequent deposition operations, wafer bow may impact contact across a substrate support, which can affect heating. A non-uniform heating profile across the substrate can affect subsequent deposition operations, causing non-uniform deposition across the surface of the substrate.

Thus, there is a need for improved systems and methods that can be used to produce high quality devices and structures. These and other needs are addressed by the present technology.

SUMMARY

Exemplary semiconductor processing chambers may include a pedestal comprising a platen configured to support a semiconductor substrate across a surface of the platen. The chambers may include a first conductive mesh incorporated within the platen and configured to operate as a first chucking mesh. The first conductive mesh may extend radially across the platen. The chambers may include a second conductive mesh incorporated within the platen and configured to operate as a second chucking mesh. The second conductive mesh may be characterized by an annular shape. The second conductive mesh may be disposed between the first conductive mesh and the surface of the platen.

In some embodiments, the chambers may include a third conductive mesh incorporated within the platen and configured to operate as a third chucking mesh. The third conductive mesh may be contained within an inner annular radius of the second conductive mesh. The third conductive mesh may be disposed between the first conductive mesh and the surface of the platen. The second conductive mesh and the third conductive mesh may be coplanar within the platen. The second conductive mesh and the third conductive mesh may be separated by an annular gap. The chamber may include a first thermocouple associated with the second conductive mesh, and a second thermocouple associated with the third conductive mesh. The first conductive mesh and the second conductive mesh may be independently operable from a power source. The chambers may include a sheet of mica disposed between the first conductive mesh and the second conductive mesh. The sheet of mica may extend into an aperture formed within the first conductive mesh, and an electrode connector may extend through the aperture and the sheet of mica to electrically couple with the second conductive mesh. The chambers may include at least two additional conductive meshes axially aligned with the first conductive mesh and the second conductive mesh.

Some embodiments of the present technology may encompass substrate support pedestals. The pedestals may include a platen configured to support a semiconductor substrate across a surface of the platen. The pedestals may include a first conductive mesh incorporated within the platen and configured to operate as a first chucking mesh. The first conductive mesh may extend radially across the platen. The pedestals may include a second conductive mesh incorporated within the platen and configured to operate as a second chucking mesh. The second conductive mesh may be characterized by an annular shape, and the second conductive mesh may be disposed between the first conductive mesh and the surface of the platen. The chambers may include a third conductive mesh incorporated within the platen and configured to operate as a third chucking mesh. The third conductive mesh may be contained within an inner annular radius of the second conductive mesh. The third conductive mesh may be disposed between the first conductive mesh and the surface of the platen.

In some embodiments, the pedestals may include a first thermocouple associated with the second conductive mesh, and a second thermocouple associated with the third conductive mesh. The second conductive mesh and the third conductive mesh may be coplanar within the platen. The second conductive mesh and the third conductive mesh may be separated by an annular gap. The first conductive mesh and the second conductive mesh may be independently operable within the substrate support from a power source. The pedestals may include a sheet of mica disposed between the first conductive mesh and the second conductive mesh. The sheet of mica may extend into an aperture formed within the first conductive mesh. An electrode connector may extend through the aperture and the sheet of mica to electrically couple with the second conductive mesh. The pedestals may include at least two additional conductive meshes concentrically aligned with first conductive mesh and the second conductive mesh.

Some embodiments of the present technology may encompass semiconductor processing methods. The methods may include clamping a substrate on a substrate support by engaging a first conductive mesh of the substrate support. The first conductive mesh may extend across the substrate support. The methods may include engaging a second conductive mesh of the substrate support. The second conductive mesh may include an annular mesh overlying the first conductive mesh. The first conductive mesh may engage the substrate at a first clamping voltage. The second conductive mesh may engage the substrate at a second clamping voltage greater than the first clamping voltage. The methods may include performing a semiconductor processing operation on the substrate. In some embodiments, the second conductive mesh may be characterized by an annular shape. The substrate support may include a third conductive mesh, and the second conductive mesh and the third conductive mesh may be coplanar.

Such technology may provide numerous benefits over conventional systems and techniques. For example, the systems may improve deposition profiles to improve uniformity across a substrate. Additionally, the technology may afford in situ adjustments to chucking voltages, which may allow adjustments to affect deposition during processing, as well as other semiconductor processing. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
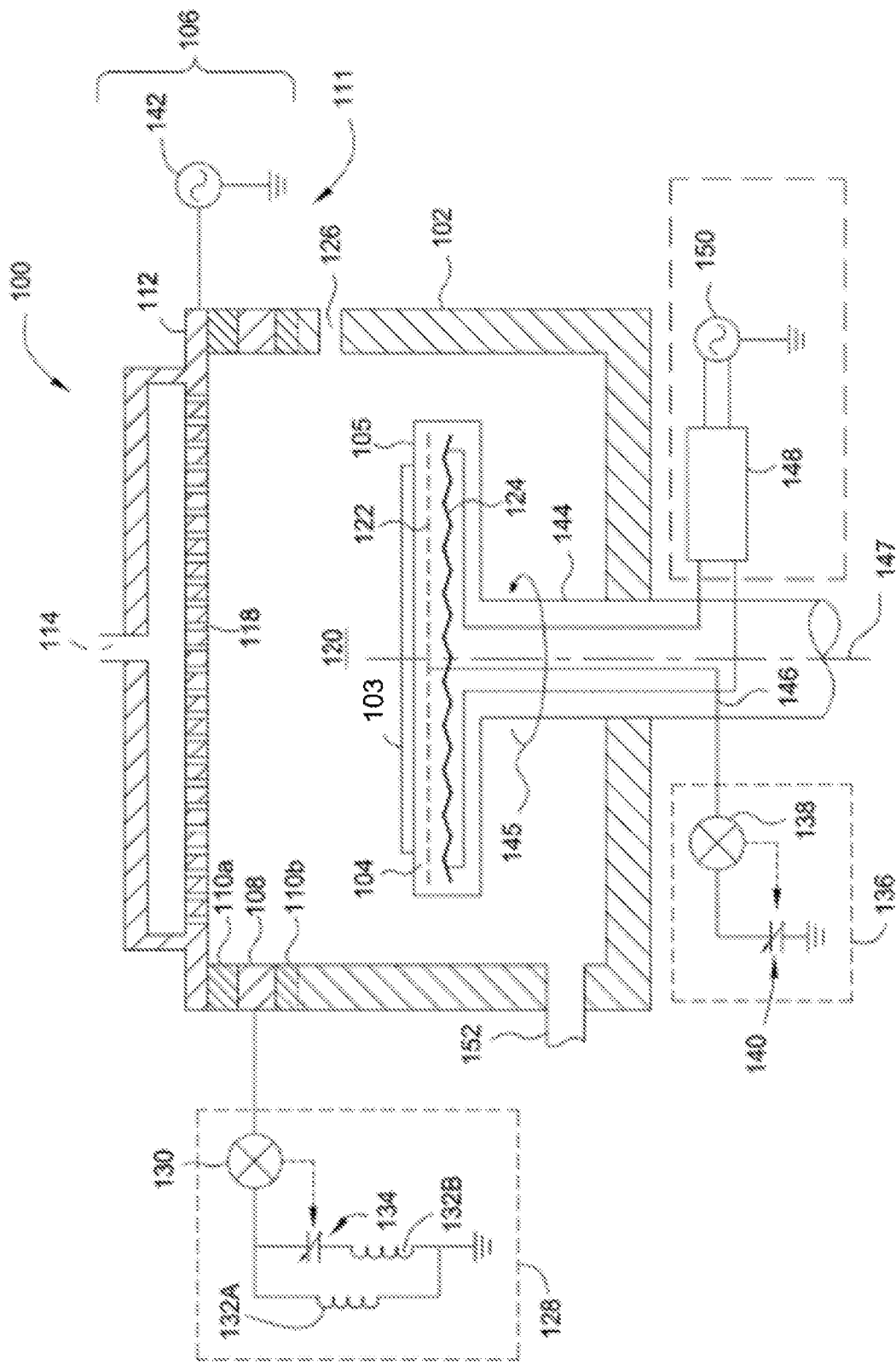
FIG. 1 shows a schematic cross-sectional view of an exemplary processing chamber according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Many material deposition processes may be temperature sensitive. In a variety of processing systems, the substrate support may operate as a heat source for a substrate during deposition. As fabrication processes are performed, a number of layers of material may be formed over a substrate, which may impart a number of stresses on the substrate. In many instances, these stresses may cause an amount of bowing of the substrate. Electrostatic chucking may counteract a number of bowing effects to maintain a flatter substrate, which may maintain more uniform contact across the substrate support, which may in turn maintain more uniform heating across the substrate.

As stresses may increase, causing more pronounced wafer bowing, many conventional technologies may attempt to counteract the wafer bow by increasing chucking voltages in an attempt to overcome the higher stress, or otherwise modifying chamber components or processes. Increasing the chucking voltage may provide limited benefits as stress increases, and simply increasing chucking voltage may produce unwanted effects. For example, many monopole chucks receive a uniform voltage bias across the entire electrode. Electric field lines tend to concentrate at a center of the substrate as electric flux may have lower losses at the center of the substrate. While this countervailing force may overcome wafer bowing caused by some film stresses, as voltage is increased, the forces may cause radial edges of the substrate to eventually pull away from the substrate support. Consequently, while uniform temperature delivery may occur nearer the center of the substrate where contact with a heated substrate support may be maintained, at peripheral edges, the gap between the substrate and support may reduce heat transfer, and a temperature gradient may appear across the substrate.

Temperature gradients across the substrate may have any number of effects. For example, while some deposition operations increase deposition at higher temperature, some other deposition operations may decrease deposition at higher temperature. In the first case, where edge bowing may have occurred on the substrate, a center-peak deposition process may occur. In the latter scenario, an edge-peak deposition process may occur. Conventional technologies may have attempted to overcome these effects by adjusting alternative aspects of processing. For example, some substrate supports may attempt to compensate for the heat loss with a multi-zone heater that may deliver even more heat to an edge region. However, besides being wasteful of energy, the gap may cause uniform heat transfer to be more difficult to produce. Additionally, changing process conditions or flow through the chamber to compensate for non-uniform deposition may require greater customization of components in an attempt to counter each unique chamber signature. Consequently, many conventional technologies continue to cause greater temperature and deposition non-uniformity.

The present technology overcomes these issues by incorporating a multi-zone electrostatic chuck. By providing a pedestal system that may adjust chucking forces at multiple locations across a substrate support, temperature discontinuities may be overcome by providing more uniform contact across a substrate surface. This may allow more uniform temperature distributions across a substrate, which may improve deposition thicknesses across the substrate for temperature sensitive depositions.

Although the remaining disclosure will routinely identify specific deposition processes utilizing the disclosed technology, it will be readily understood that the systems and methods are equally applicable to other deposition and etching chambers, as well as processes as may occur in the described chambers. Accordingly, the technology should not be considered to be so limited as for use with these specific deposition processes or chambers alone. The disclosure will discuss one possible system and chamber that may include components according to embodiments of the present technology before additional variations and adjustments to this system according to embodiments of the present technology are described.

FIG. 1 shows a cross-sectional view of an exemplary processing chamber 100 according to some embodiments of the present technology. The figure may illustrate an overview of a system incorporating one or more aspects of the present technology, and/or which may perform one or more operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power.

The lid assembly 106 and substrate support 104 of FIG. 1 may be used with any processing chamber for plasma or thermal processing. In operation, the processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2:
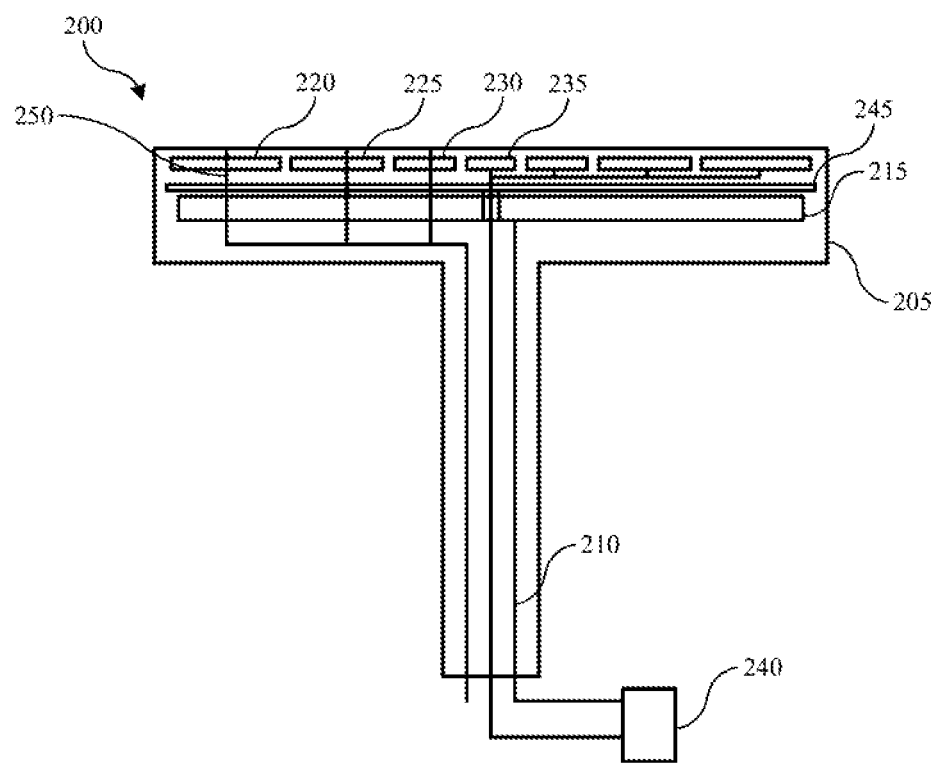
FIG. 2 shows a schematic cross-sectional view of an exemplary substrate support according to some embodiments of the present technology.

FIG. 2 shows a schematic cross-sectional view of an exemplary substrate support 200 according to some embodiments of the present technology. Substrate support 200 may be included in chamber 100 described above, or in any other processing chamber where electrostatic chucking may be employed. Substrate support 200 may include additional details of substrate support 104 described above, and may include any of the materials, components, or characteristics as previously described.

Substrate support 200 may be a pedestal as illustrated including a platen 205 and a stem 210, which may be coupled with the platen. The platen may be or include a ceramic material or any other dielectric material in some embodiments, and may be configured to support a semiconductor substrate across a surface of the platen. As noted, substrate support 200 may include any component discussed previously, including heating elements or other components, and substrate support 200 may include one or more conductive meshes, which operate as coordinated chucking mechanisms, and which may provide individually controlled chucking regions across the substrate support.

As shown, substrate support 200 may include a first conductive mesh 215 incorporated within the platen 205. First conductive mesh 215 may be configured to operate as a first electrostatic chucking mesh for clamping a substrate to the substrate support. The first conductive mesh may extend radially or laterally across the platen, and may substantially or fully cover an area across the substrate support, which may provide clamping or electrostatic force across an entire substrate when voltage is applied to the first conductive mesh 215. First conductive mesh 215 may include an aperture or gap as illustrated, which may facilitate passage of one or more components past the first conductive mesh, as will be described further below.

Substrate support 200 may also include one or more additional conductive meshes in some embodiments of the present technology, which may operate in coordination with first conductive mesh 215 to provide tunable chucking control along one or more regions of the substrate support. For example, a second conductive mesh 220 may be incorporated within the platen 205 and may be configured to operate as a second chucking mesh. As illustrated and shown further below, second conductive mesh 220 may be characterized by an annular shape, and may be disposed within the substrate support 200 between the first conductive mesh 215 and the surface of the platen on which a substrate may be seated. In other embodiments, second conductive mesh 220 may be a circular mesh, such as characterized by a diameter less than the diameter of first conductive mesh 215.

Second conductive mesh 220 may be characterized by an outer annular radius that is equal or similar to an outer diameter of the first conductive mesh 215 in some embodiments. The second conductive mesh 220 may be characterized by an inner annular radius that may be any distance towards a central axis through the pedestal, which may be in consideration of a number of additional chucking meshes incorporated within the pedestal support. For example, as illustrated, substrate support 200 may include a number of additional chucking meshes to provide additional regions of control for electrostatic chucking. As explained previously, because substrate bowing may be either tensile or compressive, enhanced chucking at different regions of the substrate may provide benefits to be applied during almost any process to accommodate substrates being processed. Accordingly, in some embodiments of the present technology, substrate supports may, in addition to a base chucking mesh, include greater than or about one, greater than or about two, greater than or about three, greater than or about four, greater than or about five, greater than or about six, or more, additional chucking meshes.

As shown in the figure, substrate support 200 may include four additional chucking meshes distributed within separate zones of the substrate support, and overlying the base chucking mesh. For example, in addition to second conductive mesh 220, a third conductive mesh 225 may be incorporated within the platen 205, and may be configured to operate as a third chucking mesh. Third conductive mesh 225 may be contained within an inner annular radius of the second conductive mesh 220 as illustrated. Third conductive mesh 225 may also be characterized by an annular shape, although in some embodiments the mesh may be characterized by a circular shape or a shape similar to first conductive mesh 215, although characterized by a diameter smaller than a diameter of first conductive mesh 215. A fourth conductive mesh 230 may be incorporated within the platen 205, and may be configured to operate as a fourth chucking mesh. Fourth conductive mesh 230 may be contained within an inner annular radius of the third conductive mesh, and may also be annular or circular as noted above depending on any additional meshes. A fifth conductive mesh 235 may be incorporated within the platen and contained within an inner annular radius of the fourth conductive mesh 230. The mesh may also be annular or circular, as illustrated, and when included as an innermost mesh, may extend coaxially along a central axis through the substrate support. It is to be understood that any number or size of meshes as illustrated may be included within substrate supports according to embodiments of the present technology, and substrate supports may include or not include any of the illustrated additional meshes.

Each of the additional chucking meshes may be co-planar within the substrate support in some embodiments as illustrated, and may be concentric about a central axis through the substrate support. The additional chucking meshes may also be coaxial with the first conductive mesh 215. As shown, a gap, such as an annular gap, may be maintained between each additional mesh to allow individual operation. In some embodiments the substrate support may be a dielectric or ceramic material, which may maintain electrical isolation of the individual meshes for operation.

Each conductive mesh incorporated within the pedestal may be coupled with a power source 240. In some embodiments each conductive mesh may be independently operable from a single power source, although in some embodiments each conductive mesh may be coupled with a separate power source. Each power source may be configured to provide a voltage to the conductive mesh for electrostatic chucking. Electrostatic chucking may nominally apply a voltage of about 200 V or less to maintain a substrate during semiconductor processing. When multiple meshes are incorporated within substrate supports, according to embodiments of the present technology, less voltage may be utilized to maintain a clamping effect with the first conductive mesh 215, while additional power may be applied with each other conductive mesh to provide tunable clamping at a number of locations across the substrate. Because the additional chucking meshes may be used to provide specific chucking voltages at each individual region, the voltage applied with the main or base chucking mesh, such as first conductive mesh 215, may be reduced to provide minimal chucking to maintain a substrate position for processing. Accordingly, in some embodiments, and depending on the configuration of the conductive meshes, a voltage applied to the first conductive mesh may be less than or about 400 V, and may be less than or about 350 V, less than or about 300 V, less than or about 250 V, less than or about 200 V, less than or about 150 V, less than or about 100 V, less than or about 80 V, less than or about 60 V, less than or about 50 V, or less. It is to be understood that any voltage discussed throughout the present disclosure may be at any polarity, and any mesh discussed may be operated at either polarity in embodiments of the present technology. For example, any of all of the meshes may be operated at the same polarity or at different polarities in embodiments of the present technology.

When a voltage is applied to any of the additional conductive meshes, the voltage may operate cumulatively with the voltage being applied by the first conductive mesh, and which may provide additional chucking on the substrate within the region associated with the additional conductive mesh. Each of the additional meshes may be operated at any voltage greater than or about 50 V, and may be operated at a voltage of greater than or about 100 V, greater than or about 150 V, greater than or about 200 V, greater than or about 250 V, greater than or about 300 V, greater than or about 350 V, greater than or about 400 V, greater than or about 450 V, greater than or about 500 V, or greater.

Consequently, when the cumulative effects of each mesh are applied, the voltage may range from about 50 V or less, depending on the voltage applied to the first conductive mesh, to a combined voltage in any particular region that may be greater than or about 50 V, and may be increased to greater than or about any of the noted voltages in combination, or within any voltage or range of voltages encompassed within the stated ranges. Although there may be correlation between increased voltage applied and the ability to increase contact at regions of the substrate, increasing the voltage beyond a certain threshold as explained previously, depending on substrate characteristics, may cause the substrate to bow, deform, or even break from the clamping force being applied. Accordingly, in some embodiments the second voltage may be maintained less than or about 1,100 V, and may be maintained less than or about 1,000 V, less than or about 900 V, less than or about 800 V, or less.

One or more thermocouples may be incorporated within the system in some embodiments to determine or estimate temperature profiles within regions along the substrate or substrate support. Based on temperature discrepancies within the substrate support, such as higher or lower temperatures, estimations may be performed to determine contact issues with a substrate. Accordingly, the temperature measurements may be used to determine whether to increase or decrease chucking in any particular region to compensate for temperature effects that may lead to non-uniform deposition. For example, thermocouple leads may extend through the substrate support stem 210, and may position or associate a thermocouple 250 within each region of the substrate support for temperature measurements. As illustrated, with four additional chucking meshes included, four thermocouples may be included with an individual thermocouple associated with each individual region, for each associated chucking mesh. In embodiments any number of additional chucking meshes and/or thermocouples may be incorporated within the substrate support to provide increased chucking or measurements at any number of regions.

Because the first conductive mesh may be operated at all times, and the additional conductive meshes may be operated based on process needs, losses or leakage may occur between the components in some embodiments. Accordingly, in some embodiments a material 245 may be disposed between the first chucking mesh and each other overlying chucking mesh. The material may be any electrically insulating material, and in some embodiments the material may also be thermally conductive to maintain sufficient heat transfer from an underlying heater element or elements to the substrate. For example, sheet mica or other electrically insulating and/or thermally conductive materials may be disposed between the first conductive mesh and the other conductive meshes included between the first conductive mesh and the surface of the substrate support. Additionally, the mica sheet may also extend vertically through a gap or aperture formed within the first conductive mesh through which electrode connectors or couplings and/or thermocouples may extend for connecting with overlying electrodes or positioning within the substrate support. This may further provide insulation between components in some embodiments.

In operation, voltage may be applied in multiple ways. For example, a base voltage for electrostatic coupling may be applied to the first conductive mesh 215, which may be a minimal voltage in some embodiments. Depending on a wafer bow or profile, additional conductive meshes may be engaged to increase positional chucking of the substrate. For example, in some embodiments where a radial edge of the substrate may be bowing away from the substrate support, second conductive mesh 220 may be engaged to increase the voltage applied to this region. Similarly, depending on deposition profiles, chucking may be increased or decreased in specific regions by modulating chucking at any of the conductive meshes. For example, in addition to increasing positional clamping by engaging a specific conductive mesh, in some embodiments chucking within a specific region may be effectively lowered at a particular region by increasing chucking at all other regions except that particular region. Any number of other adjustments are similarly encompassed by the present technology, and it is to be understood that the examples discussed are not intended to limit the present technology.

Figure 3:
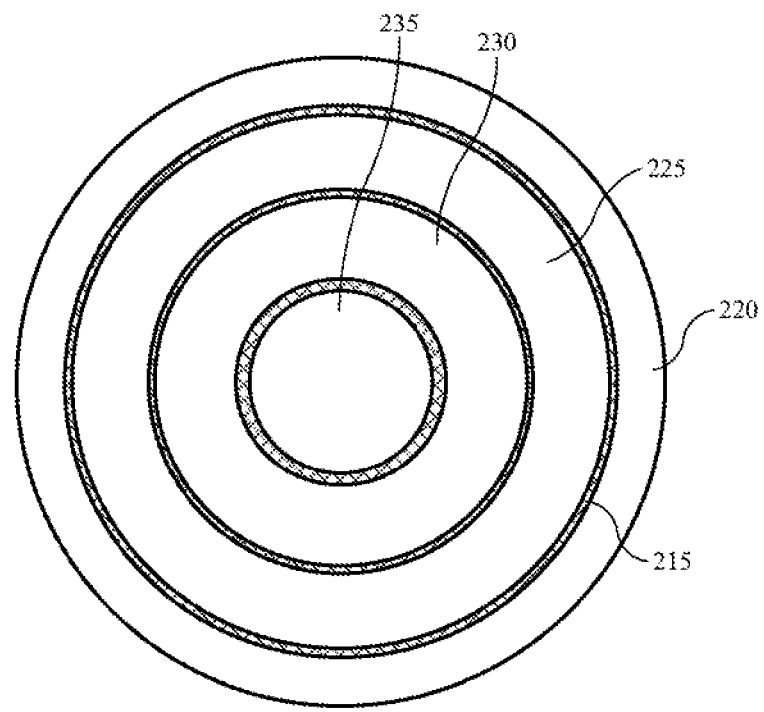
FIG. 3 shows a schematic plan view of an exemplary substrate support according to some embodiments of the present technology.

FIG. 3 shows a schematic plan view of an exemplary substrate support 200 according to some embodiments of the present technology, and may show a top view of substrate support 200 described above. It is to be understood that the substrate support may include any of the features, components or characteristics of any other substrate support discussed elsewhere. As illustrated, the annular nature of several of the additional chucking meshes may be seen in this figure. For example, each of second conductive mesh 220, third conductive mesh 225, fourth conductive mesh 230, and fifth conductive mesh 235, may be viewed to illustrate the corresponding regions of coverage. Additionally, a gap is shown between each individual chucking mesh, which may limit interaction between the conductive meshes. Within each gap may be seen first conductive mesh 215, which may extend across the substrate support for clamping across an entire substrate as previously described.

Figure 4:
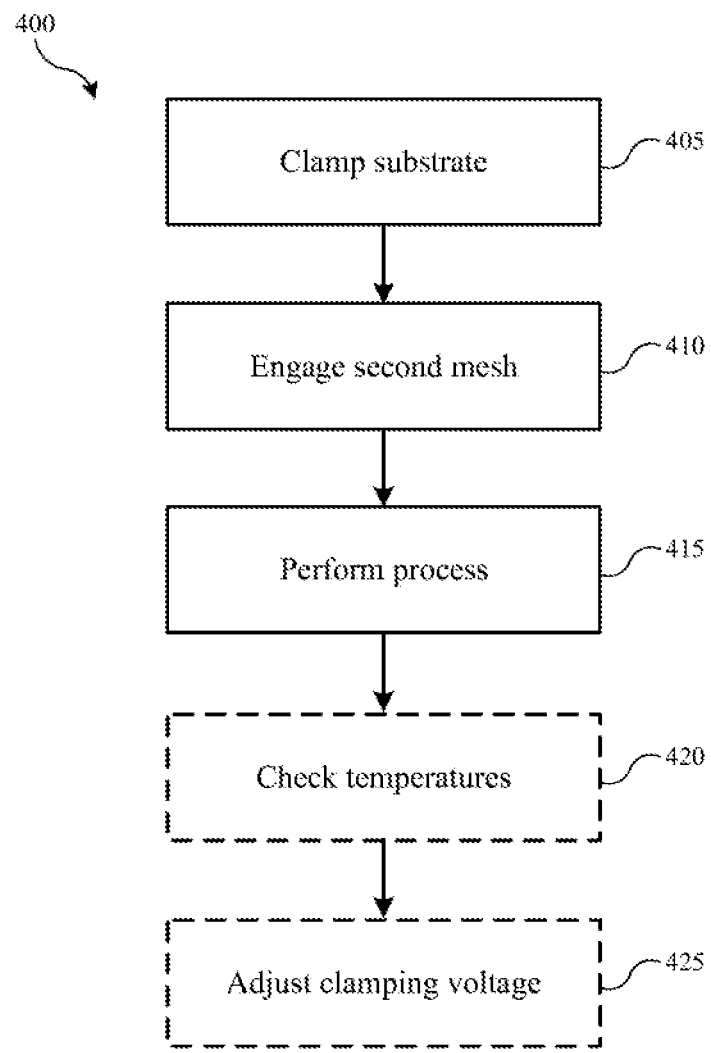
FIG. 4 shows exemplary operations in a method of semiconductor processing according to some embodiments of the present technology.

FIG. 4 shows exemplary operations in a method 400 of semiconductor processing according to some embodiments of the present technology. The method may be performed in one or more chambers, including any of the chambers previously described, and which may include any of the substrate supports discussed previously, along with any other aspect of any system or chamber previously described. Method 400 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated. For example, and as described previously, operations may be performed prior to delivering a substrate into a processing chamber, such as processing chamber 100 described above, in which method 400 may be performed with or without some or all aspects of substrate support 200 previously described.

Method 400 may include clamping a semiconductor substrate on a substrate support within a processing region of a semiconductor processing chamber at operation 405. The substrate may be clamped by engaging a first conductive mesh of the substrate support, such as first conductive mesh 215 described above, which may extend across the substrate support. One or more additional conductive meshes within the substrate support may be engaged at operation 410. The one or more additional conductive meshes may include at least one annular mesh or circular mesh, or a mesh of any other geometry, overlying the first conductive mesh. The first conductive mesh may engage the substrate at a first clamping voltage, such as any voltage previously noted. The one or more additional conductive meshes may then engage a region of the substrate at a second clamping voltage greater than the first clamping voltage. Because of the cumulative effect of operating a secondary conductive mesh in some embodiments, the one or more additional conductive meshes may be operated at a lower voltage than the first conductive mesh, while the cumulative effect may further clamp the substrate. For example, where a first conductive mesh is operated at 100 V, a second conductive mesh may be operated at 50 V in a particular region of the substrate support. Thus, while other regions of the substrate may be engaged at 100 V, the region corresponding to the second conductive mesh may be engaged at 150 V, for example. Any other combinations or chucking scenarios are similarly encompassed as previously described, and as would be understood to be similarly encompassed by the present technology.

A semiconductor processing operation may then be performed at operation 415, which may involve a deposition, etch, or any other process that may benefit from electrostatic chucking as described. In some embodiments one or more temperatures may be monitored across the substrate or substrate support at optional operation 420. The temperatures may be used to determine whether a uniform process may be performed, or whether temperature effects may be occurring. In some embodiments, these readings or measurements may be used to adjust chucking voltages in one or more regions of the substrate support. For example, in one non-limiting embodiment, a substrate temperature may be lower, which may be caused by lack of complete contact. This may register as reduced temperature at the substrate or substrate support, or the substrate support temperature may be higher, for example, due to reduced heat transfer. In response, chucking voltage for an associated chucking mesh may be increased in that region or otherwise adjusted at optional operation 425, which may provide more uniform heat transfer to the region of the substrate. Additionally, subsequent a process, such as a deposition process, thickness measurements across the substrate may correlate with regions of decreased contact at the substrate. Accordingly, subsequent processing may increase or decrease chucking in one or more associated regions to accommodate the thickness change, and improve uniformity across the substrate.

By utilizing methods and components according to embodiments of the present technology, material deposition or formation may be improved. By providing increased control of chucking across a substrate support, improved uniformity of temperature distribution may be produced, which may improve processes being performed.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing chamber comprising:
   a pedestal comprising a platen configured to support a semiconductor substrate across a surface of the platen;
   a first conductive mesh incorporated within the platen and configured to operate as a first chucking mesh, wherein the first conductive mesh extends radially across the platen;
   a second conductive mesh incorporated within the platen and configured to operate as a second chucking mesh, wherein the second conductive mesh is characterized by an annular shape, and wherein the second conductive mesh is disposed between the first conductive mesh and the surface of the platen; and
   a sheet of mica disposed between the first conductive mesh and the second conductive mesh.

2. The semiconductor processing chamber of claim 1, further comprising a third conductive mesh incorporated within the platen and configured to operate as a third chucking mesh, wherein the third conductive mesh is contained within an inner annular radius of the second conductive mesh, and wherein the third conductive mesh is disposed between the first conductive mesh and the surface of the platen.

3. The semiconductor processing chamber of claim 2, wherein the second conductive mesh and the third conductive mesh are coplanar within the platen.

4. The semiconductor processing chamber of claim 3, wherein the second conductive mesh and the third conductive mesh are separated by an annular gap.

5. The semiconductor processing chamber of claim 4, further comprising:
   a first thermocouple associated with the second conductive mesh, and
   a second thermocouple associated with the third conductive mesh.

6. The semiconductor processing chamber of claim 1, wherein the first conductive mesh and the second conductive mesh are independently operable from a power source.

7. The semiconductor processing chamber of claim 1, wherein the sheet of mica extends into an aperture formed within the first conductive mesh, and wherein an electrode connector extends through the aperture and the sheet of mica to electrically couple with the second conductive mesh.

8. The semiconductor processing chamber of claim 1, further comprising at least two additional conductive meshes axially aligned with the first conductive mesh and the second conductive mesh.

9. A substrate support pedestal comprising:
   a platen configured to support a semiconductor substrate across a surface of the platen;
   a first conductive mesh incorporated within the platen and configured to operate as a first chucking mesh, wherein the first conductive mesh extends radially across the platen;
   a second conductive mesh incorporated within the platen and configured to operate as a second chucking mesh, wherein the second conductive mesh is characterized by an annular shape, and wherein the second conductive mesh is disposed between the first conductive mesh and the surface of the platen; and
   a third conductive mesh incorporated within the platen and configured to operate as a third chucking mesh, wherein the third conductive mesh is contained within an inner annular radius of the second conductive mesh, and wherein the third conductive mesh is disposed between the first conductive mesh and the surface of the platen.

10. The substrate support pedestal of claim 9, further comprising:
    a first thermocouple associated with the second conductive mesh, and
    a second thermocouple associated with the third conductive mesh.

11. The substrate support pedestal of claim 9, wherein the second conductive mesh and the third conductive mesh are coplanar within the platen.

12. The substrate support pedestal of claim 11, wherein the second conductive mesh and the third conductive mesh are separated by an annular gap.

13. The substrate support pedestal of claim 9, wherein the first conductive mesh and the second conductive mesh are independently operable within the substrate support from a power source.

14. The substrate support pedestal of claim 9, further comprising a sheet of mica disposed between the first conductive mesh and the second conductive mesh.

15. The substrate support pedestal of claim 14, wherein the sheet of mica extends into an aperture formed within the first conductive mesh, and wherein an electrode connector extends through the aperture and the sheet of mica to electrically couple with the second conductive mesh.

16. The substrate support pedestal of claim 9, further comprising at least two additional conductive meshes concentrically aligned with the first conductive mesh and the second conductive mesh.

17. A semiconductor processing method comprising:
    clamping a substrate on a substrate support by engaging a first conductive mesh of the substrate support, wherein the first conductive mesh extends across the substrate support;
    engaging a second conductive mesh of the substrate support, wherein the second conductive mesh comprises an annular mesh overlying the first conductive mesh, wherein the first conductive mesh engages the substrate at a first clamping voltage, and wherein the second conductive mesh engages the substrate at a second clamping voltage greater than the first clamping voltage; and
    performing a semiconductor processing operation on the substrate.

18. The semiconductor processing method of claim 17, wherein the second conductive mesh is characterized by an annular shape, wherein the substrate support further comprises a third conductive mesh, and wherein the second conductive mesh and the third conductive mesh are coplanar.

* * * * *